United States Patent [19]

Andrews

[11] Patent Number: 5,379,302
[45] Date of Patent: Jan. 3, 1995

[54] ECL TEST ACCESS PORT WITH LOW POWER CONTROL

[75] Inventor: John R. Andrews, Saco, Me.

[73] Assignee: National Semiconductor Corporation, Santa Clara, Calif.

[21] Appl. No.: 42,127

[22] Filed: Apr. 2, 1993

[51] Int. Cl.⁶ .............................................. G06F 11/00
[52] U.S. Cl. ................................ 371/22.3; 324/158.1; 371/22.1; 371/22.2; 326/16; 326/126; 326/127; 327/199
[58] Field of Search .................... 371/22.3, 22.1, 22.5, 371/22.6, 27, 15.1, 21.4; 324/73.1, 158 R; 307/272.2, 291, 465

[56] References Cited

U.S. PATENT DOCUMENTS

| | | |
|---|---|---|
| 4,517,476 | 5/1985 | Barre . |
| 4,680,761 | 7/1987 | Burkness ............................. 371/22.1 |
| 4,837,765 | 6/1989 | Suzuki ................................ 371/22.1 |
| 5,013,938 | 5/1991 | Estrada . |
| 5,101,153 | 3/1992 | Morong, III ..................... 324/158 R |
| 5,109,190 | 4/1992 | Sakashita et al. ................... 324/73.1 |
| 5,155,732 | 10/1992 | Jarwala ............................. 324/73.1 |
| 5,222,068 | 6/1993 | Burchard .......................... 371/22.3 |
| 5,228,045 | 7/1993 | Chiles ................................ 371/22.3 |
| 5,231,314 | 7/1993 | Andrews ......................... 324/158 R |
| 5,254,942 | 10/1993 | D'Souza et al. ................ 324/158 R |
| 5,260,950 | 11/1993 | Simpson et al. ..................... 371/22.3 |
| 5,281,864 | 1/1994 | Hahn et al. ......................... 307/272.2 |

OTHER PUBLICATIONS

Maunder & Tulloss "The Test Access Port and Boundary Scan Architecture", IEE Computer Society Press, Los Alamitos, Calif. 1990.

IEEE Standard Test Access Port and Boundary Scan Architecture, IEEE Computer Society, (IEEE Standard 1149.1) IEEE, New York 1990.

*Primary Examiner*—Emanuel T. Voeltz
*Assistant Examiner*—Alan H. Tran
*Attorney, Agent, or Firm*—Daniel H. Kane; Richard C. Calderwood; Vincenzo D. Pitruzzella

[57] ABSTRACT

An integrated circuit device ECL test access port (TAP) is constructed for low static current requirements and low power consumption when the TAP is inactive. The ECL test access port may conform with IEEE Standard 1149.1 Test Access Port and Boundary Scan Architecture. An SCS logic circuit (50) is incorporated in the TAP controller coupled to the flip-flops (32,34,36,38) of the TAP controller n state finite machine for generating a current sink switch control signal (SCS) according to the state of the TAP controller. A current sink switch circuit (24) is coupled to respective current sinks of ECL gates incorporated in the boundary scan register (BSR/TDR1), design specific TAP data registers (DS/TDRs), TAP instruction register (TIR), and device identification register (DIR/TDR3). The current sink switch circuit (24) has an input coupled to the SCS logic circuit (50) to receive the current sink switch control signal (SCS). The current sink switch circuit is constructed to turn off the respective current sinks (Q4/R5, Q5/R6, Q6/R7) of the selected TAP registers in response to an SCS signal having a first logic value to reduce power dissipation when the TAP controller is in the inactive test logic reset (TLR) state. The current sink switch circuit turns on the respective current sinks of the selected TAP registers in response to an SCS signal having a second logic value when the test controller is in an active test mode state. The SCS logic circuit incorporates appropriate decoder or logic gates (40,52) and reset signal (RESET*) to filter out glitches and spikes and provide a clean SCS signal for holding on or off the respective current sinks of the ECL logic gates of the selected TAP registers.

19 Claims, 9 Drawing Sheets

ECL TEST ACCESS PORT WITH LOW POWER CONTROL

TECHNICAL FIELD

This invention relates to a new emitter coupled logic (ECL) or current mode logic (CML) IC device having a standard test access port (TAP) of the type specified in IEEE Standard 1149.1 Test Access Port and Boundary Scan Architecture and in the protocol of the Joint Test Action Group JTAG Version 2.0. The test logic of the TAP is constructed with ECL logic gates and corresponding current sinks which normally require high static current and power consumption at undesirable levels when the TAP is inactive. The invention provides a TAP current sink switch circuit coupled to the current sinks of selected registers of the test access port for turning on and off the respective current sinks. A new current sink switch control signal logic circuit is also incorporated in the test logic controller or TAP controller. The current sink switch control signal SCS is derived from the TAP controller itself for turning off selected current sinks when the TAP controller is in the test logic reset (inactive) state and for turning on the selected current sinks during active test mode states of the TAP controller.

BACKGROUND ART

The use of emitter coupled logic and current mode logic in standard test access ports is described generally in Maunder and Tulloss, *THE TEST ACCESS PORT AND BOUNDARY SCAN ARCHITECTURE*, IEEE Computer Society Press, Los Alamitos, Calif. 90720-1264 (1990), Chapter 16, "Tapping Into ECL Chips". Maunder and Tulloss describe a special ECL input buffer for use at the input pins of an ECL test access port for operation of the TAP in compliance with IEEE Standard 1149.1. Alternatively a TTL/ECL or CMOS/ECL translator can be used at the input pins.

Generally, the ECL TAP is constructed with ECL logic gates or differential amplifiers and accompanying current sinks. A disadvantage associated with ECL TAP's and ECL logic gates is the high static current requirements and consequent high power dissipation associated with ECL differential logic gates and amplifiers. A relatively high static sinking current or tail current conventionally flows through the current sink path whether the ECL logic gate is in the bistate logic operating mode or in a standby cutoff mode. Since the JTAG ECL TAP is generally used only during testing and test mode select functions, there is substantial wasted power dissipation through the ECL TAP components during normal non-test or "mission" operation of the ECL device IC system logic. Test mode operation constitutes only a small percentage of the operating time of the chip.

The present invention seeks to provide an ECL integrated circuit device with a low power consumption ECL test access port. The emitter coupled logic and current mode logic family of integrated circuit technology is applied in the standard test access port (TAP) such as the IEEE Standard 1149.1 Test Access Port and Boundary Scan Architecture and the JTAG Version 2.0 Protocol for a test access port but without the foregoing disadvantages. The present invention is applicable to ECL IC devices with a test access port of the type illustrated in FIGS. 1–4.

The test access port (TAP) defined by IEEE Standard 1149.1 Test Access Port and Boundary Scan Architecture and JTAG Version 2.0 Protocol for incorporation on an integrated circuit chip is illustrated in FIG. 1. At least four pins of the IC device and a varying percentage of the chip silicon surface area are dedicated to the test access port and associated TAP circuits. The TAP is intended to standardize and facilitate boundary scan testing and other design specific testing of the IC device while the chip is still mounted on a circuit board and without separate test instrumentation. The TAP permits all phases of testing with access at all pins of the IC device through boundary scan principles even for surface mount devices and without the necessity of "bed of nails" physical contact. Access to all pins for testing is achieved electronically through the boundary scan shift register, one of the test data registers of the test access port.

The dedicated pins for the test access port include a test data input (TDI) pin to receive data signals for the test data registers (TDRs) and to receive instruction codes for the test instruction register (TIR). The test data output (TDO) pin shifts out data signals from the TDRs and instruction codes from the TIR for example for input to the TDI pin of the next IC device on a circuit board. IEEE Standard 1149.1 compliant chips of a circuit board may be coupled with boundary scan registers in series in a "daisy chain" forming a selected test ring for test mode functions. Data signals and instruction codes are shifted out from the TDRs and TIR to the TDO pin through respective multiplexers MUX, a latch or passgate, and an output buffer coupled to the TDO pin.

The remaining two required pins of the standard TAP are a test mode select (TMS) pin and a test clock (TCK) pin which provide respective control and clock signals to the TAP controller which in turn directs operation of the test access port. In response to TMS control signals and TCK clock signals, the TAP controller selects either the instruction register TIR for entry of an instruction code from the TDI pin, or selects a test data register (TDR) for entry of data signals from the TDI pin. According to the selected mode of operation, for example a test to be performed or a design specific procedure to be followed, the appropriate instruction code is shifted into the instruction register (TIR). The instruction code is decoded by instruction decode register (IDR) and the TIR selects one or more of the test data registers (TDRs) required for the selected test or procedure.

The minimum required TDRs include the boundary scan register TDR1 for performing boundary scan testing and the bypass register TDR2 for bypassing data signals and instruction codes to the TDO pin in order to bypass a particular chip for a selected test or other procedure. The test logic may also include design specific TDRs such as TDR4 illustrated in FIG. 1 for performing a customized or design specific test procedure. An optional TAP test logic reset (TRST) pin may be dedicated for an asynchronous resetting of the TAP controller.

The central operating feature of the standard TAP is the boundary scan register TDR1 shown in more detail in FIG. 2. The boundary scan register TDR1 is a shift register of series coupled boundary scan cells (BSC). A boundary scan cell BSC is coupled at each pin of the IC device in the system logic path between the respective input or output pin and the IC device internal system logic. Under appropriate program control, data signals may be shifted into position through the boundary scan path of the boundary scan register for example for input to the IC device system logic at the input pins. The processed data signals may be latched at the boundary scan cells adjacent to output pins to be shifted out through the boundary scan path and TDO pin for test analysis. Each boundary scan cell (BSC) generally incorporates two flip-flops and two multiplexers for accomplishing these boundary scan test objectives. The boundary scan register and boundary scan test principles permit access to all pins of the IC device without physical contact by a "bed of nails" testing apparatus.

A more detailed fragmentary block diagram of the test access port data registers TDRs is illustrated in FIG. 3. FIG. 3 shows a bank of TDRs including the minimum required boundary scan register TDR1 and bypass register TDR2. An optional test data register is the device identification register TDR3 for coded identification of a device name. Additionally there may be a plurality of specialized design specific test data registers TDR4, TDR5 and TDRN etc. for design specific tests or procedures.

A state diagram showing the operation of the TAP controller for a standardized test access port is illustrated in FIG. 4. The TAP controller is an "n" state finite machine, in this case a 16 state finite machine composed of four flip flops which in combination determine the 16 states of the TAP controller. While inactive, the TAP controller remains in the Test Logic Reset state or condition. The TAP controller is held in this state while all the outputs of the flip flops are logic high level 1 and as long as the TMS signal is 1.

When the TMS pin changes from 1 to 0, a test procedure is initiated with transition to the Run Test/Idle state. From the Run Test/Idle condition, the TAP controller selects either the TAP test instruction register TIR or one of the TAP test data registers TDRs for shifting respective instruction codes or data signals into and from the captured register TDRN between the TDI and TDO pins. In the state diagram of FIG. 4, the binary digits accompanying the flow chart arrows represent the TMS signal. The indicated transition occurs for the specified value of the TMS signal at the next rising edge of a clock signal TCK. As used herein, the Test Logic Reset (TLR) state of the TAP controller is referred to as the inactive state. All other states of the TAP controller state diagram are referred to as the active state or active states.

Further background information and detailed instruction on the construction and operation of standardized test access ports are found in the following references: IEEE *STANDARD TEST ACCESS PORT AND BOUNDARY SCAN ARCHITECTURE*, Test Technology Technical Committee of the IEEE Computer Society, Institute of Electrical and Electronics Engineers, Inc., 345 East 47th Street, New York, N.Y. 10017 USA (May 21, 1990) (IEEE Standard 1149.1-1990); Colin M. Maunder and Rodham E. Tulloss, *THE TEST ACCESS PORT AND BOUNDARY SCAN ARCHITECTURE*, IEEE Computer Society Press Tutorial, IEEE Computer Society Press, 10662 Los Vaqueros Circle, P.O. Box 3014, Los Alamitos, Calif. 90720-1264 (IEEE 1990); John Andrews, "IEEE *Standard Boundary Scan* 1149.1", National Semiconductor Corporation, 333 Western Avenue, South Portland, Me 04106, a paper delivered at WESCON, San Francisco, 1991.

As noted by Maunder and Tulloss, the design specific TAP test data registers (TDRs) can be part of the on-chip system logic or the test logic and can have both system and test functions. The dedicated test access port pins afford convenient access to the chip for example from a portable computer at an external location for testing or otherwise servicing the IC device in situ in its operating circuit board and environment.

According to the terminology adopted in this specification, the reference to the test access port or TAP includes the test logic as well as the dedicated pins of the TAP. The reference to "test" components and elements of the TAP is generalized to "TAP" components and elements to encompass both test logic functions and system logic functions for which the TAP might be used. Thus, the standard test data input pin, test data output pin, test mode select pin, test clock pin, test data registers, and test instruction register etc. may also be referred to herein more generally as TAP data input (TDI) pin, TAP data output (TDO) pin, TAP mode select (TMS) pin, TAP clock (TCK) pin, TAP test data registers (TDRs), and TAP instruction register (TIR) etc. This more generalized terminology is appropriate to objects and features of the present invention for ECL implementation of the TAP components and elements whether used for test functions or design specific system logic functions of an IC device.

OBJECTS OF THE INVENTION

It is therefore of the present invention to provide a new IC device ECL test access port with relatively low static current and power dissipation when the ECL TAP is inactive in the test logic reset TLR state.

Another object of the invention is to control the current sinks in ECL gates of selected registers of the ECL test access port from the TAP controller itself according to the state of the ECL TAP controller. In this way, the static current and power requirements of the ECL TAP can be "self regulated" according to the state of the TAP controller "n" state finite machine.

A further object of the invention is to hold on or off unambiguously the current sinks of ECL gates in the selected registers of the ECL TAP. To this end, the invention provides "clean" glitch free switch control signals so that the ECL gate current sinks remain functioning during active test mode states of the ECL TAP controller but are off during the inactive TLR state.

DISCLOSURE OF THE INVENTION

In order to accomplish these results, the invention incorporates an SCS logic circuit in the TAP controller of an ECL test access port. The SCS logic circuit is coupled to the flip-flops of the n state finite machine of the TAP controller for generating a current sink switch control signal (SCS) according to the state of the TAP controller. The SCS logic circuit generates a current sink switch control signal SCS with a first logic value when the TAP controller is in the inactive test logic reset (TLR) state and a second logic value when the TAP controller is in an active test mode state.

The invention also provides a current sink switch circuit coupled to respective current sinks of ECL gates incorporated in selected registers of the ECL test access port. The selected registers of the ECL TAP include the boundary scan register (BSR/TDR1) and design specific test data registers (DS/TDR's). The current sink switch circuit has an SCS input coupled to the SCS logic circuit to receive the current sink switch control signal SCS. The current sink switch circuit is constructed to turn off the respective current sinks in ECL gates of the selected ECL TAP registers in response to the first logic state of the SCS signal to reduce power dissipation when the TAP controller is in the inactive test logic reset (TLR) state. The current sink switch circuit is also constructed to turn on the current sinks in response to a second logic state of the SCS signal when the TAP controller is in transition to an active test mode state.

Generally, the current sinks for ECL gates for all TAP registers that function only during active test mode states can be switched off to reduce static current and conserve power when the ECL TAP is inactive in the TLR state. For example, if the ECL TAP incorporates an IC device identification register (DIR/TDR3), then the device identification register may also be one of the selected registers. The current sink switch circuit is coupled to the respective current sinks of ECL gates incorporated in the device identification register. Similarly, the current sink switch circuit can be coupled to respective current sinks of ECL gates incorporated in the TAP instruction register (TIR). The TAP instruction register (TIR) receives instruction codes for the TAP controller. As hereafter described, the current sinks of the TIR can be turned on with sufficient speed to be ready to receive an instruction code when the TAP controller exits the TLR inactive state.

The current sinks for ECL gates or ECL differential amplifiers of the registers of the ECL TAP generally include a bipolar tail current transistor and a tail resistor coupled to the emitter node of the tail current transistor. According to the invention, the current sink switch circuit is a bias network coupled to the base nodes of the respective tail current transistors for the selected registers. The bias network (Q1,Q2,Q3,R1) has an input transistor (QP1) coupled to the SCS logic circuit for turning on the bias network to the conducting state in response to the second SCS signal at the input transistor (QP1). The bias network in turn then turns on the respective current sinks and holds on the current sinks while the TAP controller is in an active test mode state. The input transistor (QP1) turns off the bias network and thereby turns off the respective current sinks in response to the first SCS signal when the TAP controller is in the inactive TLR state.

In the preferred example embodiment, the SCS logic circuit includes a first logic gate (40) having inputs coupled to the outputs of the TAP controller n state finite machine flip-flops. The TAP controller also provides a reset output (RESET*) from a reset flip flop (42) having an input coupled to the output of the first logic gate (40). The reset output (RESET*) and the first logic gate output are coupled to inputs of a second logic gate (52) which provides at its output the current sink switch signal SCS. In the preferred example the first logic gate (40) is a NAND gate while the second logic gate (42) is a negative input NAND gate, referred to herein as a NOT/NAND gate. Alternatively the second logic gate is a logic OR gate, the logical equivalent of the NOT/-NAND gate.

An advantage of this SCS logic circuit arrangement is that the output of the first logic gate which is based on the outputs of the flip-flops of the n state finite machine of the TAP controller, provides a speed advantage in turning on the current sinks. This first logic gate output signal however may be subject to fluctuations or glitches which may adversely affect the condition of the current sinks. It is therefore conjoined logically with the TAP controller reset signal (RESET*) which provides a "clean" glitch free reliable signal for holding on or off the current sinks. The SCS logic circuit of the invention is therefore capable of returning the current sinks to the conducting state with sufficient speed when the TAP controller undergoes transition from the inactive TLR state to active test mode states of the TAP controller state diagram. In this respect the ECL TAP of the present invention conforms with the requirements of IEEE Standard 1149.1. Additionally the SCS logic circuit then provides glitch free signals for reliably holding the current sinks in their respective on or off conditions according to the state of the TAP controller.

More generally the first logic gate is any desired decoding logic circuit or decoder having inputs coupled to the outputs of the test controller n state finite machine flip flops. The decoder monitors the states of the respective flip flops and provides the output signal required for a particular implementation and for whatever logic combinations are used by the n state finite machine. The decoder output is combined with the RESET* output to provide the SCS signal.

Other objects, features, and advantages of the invention are apparent in the following specification and accompanying drawings.

BRIEF DESCRIPTION OF THE DRAWINGS

FIG. 8 composed of FIGS. 8A and 8B is a schematic circuit diagram of an example TAP controller according to the invention incorporating an SCS logic circuit for generating the SCS signals. The component

DESCRIPTION OF PREFERRED EXAMPLE EMBODIMENTS AND BEST MODE OF THE INVENTION

Figure 5:
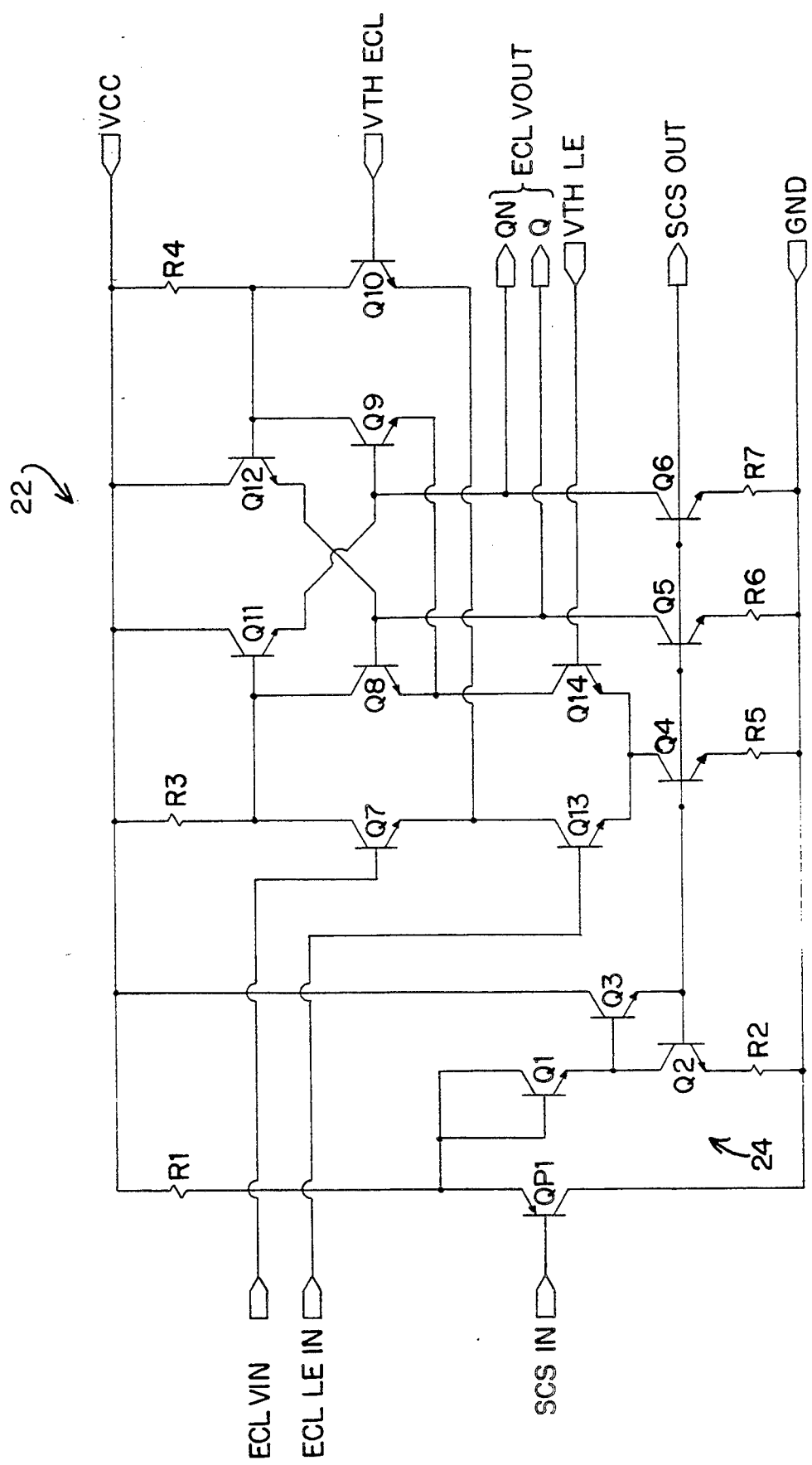
FIG. 5 is a schematic circuit diagram of an ECL latch of a selected register of the ECL TAP incorporating a current sink switch circuit according to the invention.

A current sink switch circuit 24 for switching on and off the current sinks CS of ECL gates for the selected registers in the ECL test logic of the test access port is shown incorporated in the latch circuit 22 of FIG. 5.

The latch circuit 22 is an integral component of the flip flops of a selected register as hereafter described. The latch circuit 22 is composed of the essential elements of an ECL latch circuit as well as the current sink switch circuit.

As shown in FIG. 5 the elements of the ECL latch circuit include the basic ECL data input gate or differential amplifier Q7,Q10 having ECL gate transistors Q7,Q10 coupled at a common emitter node. The ECL data input ECL VIN is coupled to the base node of ECL gate NPN input transistor Q7. An intermediate reference voltage VTH ECL is coupled to the base node of the ECL gate reference transistor Q10. The intermediate reference voltage VTH ECL is also sometimes referred to as VREF or VBB. The latch enable ECL gate or ECL differential amplifier is provided by NPN transistors Q13,Q14 coupled at a common emitter node. The ECL latch enable input ECL LE IN is coupled to the base node of ECL gate latch enable input transistor Q13 while an intermediate reference voltage VTH LE is applied at the base node of ECL gate reference transistor Q14. As hereafter described the ECL latch enable input ECL LE IN provides the clock signal input CK for the latch and any flip flop in which it is incorporated and is in turn provided by the ECL TAP clock signal TCK.

As hereafter described the latch 22 is in the transparent mode transmitting data signals from the ECL data input ECL VIN to the complementary latch outputs Q,QN at the ECL data output ECL VOUT when a logic high potential level latch enable signal ECL LE IN or clock signal CK appears at the base node of latch enable ECL gate input transistor Q13. With latch enable ECL gate input transistor Q13 conducting and latch enable ECL gate reference transistor Q14 not conducting, the ECL data input gate Q7,Q10 can operate according to its normal bistate operating mode delivering complementary output signals at the complementary output nodes Q,QN of ECL VOUT. This is accomplished by emitter follower output transistors Q11,Q12 which are cross coupled through feedback transistors Q8,Q9 to the collector node of latch enable ECL gate reference transistor Q14. When Q14 is not conducting the emitter follower output transistors Q11 and Q12 deliver respective complementary output signals to the output nodes Q,QN in the normal bistate operating mode. This occurs so long as the latch enable input signal ECL LE IN remains at a logic high potential level, i.e. following the rising edge of a clock signal CK.

When the latch enable input signal ECL LE IN makes a transition from high to low potential level, i.e. following the falling edge of a clock signal CK, the latch enable ECL gate reference transistor Q14 becomes conducting, draws the tail current, turns on feedback transistors Q8 and Q9, and holds off the ECL data input gate transistors Q7 and Q10. An input data signal at the data input ECL gate Q7,Q10 is therefore "latched" and is no longer transmitted to the output nodes Q,QN. The emitter coupled pair Q8,Q9 holds the logic value previously entered at ECL VIN.

Referring to the bottom of the circuit of FIG. 5 it is noted that three current sinks Q4/R5, Q5/R6, Q6/R7 are required for operation of the ECL latch circuit. Each current sink is composed of a respective tail transistor Q4,Q5,Q6 and a respective tail resistor R5,R6,R7 for generating tail currents through the ECL output gates and output circuits from VCC to ground GND. Current sink Q4/R5 operates the data input ECL gate Q7,Q10 and the latch enable input ECL gate Q13,Q14. Current sinks Q5/R6 and Q6/R7 operate the output circuits including emitter follower output transistors Q11,Q12 and feedback transistors Q8,Q9. The current sinks continue to draw some current under all conditions adding an undesirable element of static current and power consumption to the ECL circuit implementation.

A current sink switch circuit (CSSC) 24 is incorporated in the latch circuit 22 for turning on and off the current sinks Q4/R5, Q5/R6, and Q6/R7 to reduce static current and power consumption. The current sink switch circuit 24 includes a PNP input transistor QP1, collector emitter path resistor R1, and a bias network Q1,Q3,Q2,R2. The primary current path of the CSSC input transistor QP1 is coupled between resistor R1 and ground GND, while the base node is coupled to the switch control signal input SCS IN. The switch control signal SCS at SCS IN is derived from the SCS logic circuit of the TAP controller as herein described. The SCS signal at SCS IN is at a logic low potential level, referred to as the first SCS signal, when the TAP controller and test access port are in the inactive TLR state. The SCS signal at SCS IN is at a logic high potential level, referred to as the second SCS signal, when the TAP controller and test access port are in an active test mode state.

The input of the bias network at the base collector shorted node of BCS transistor Q1 is coupled to the emitter node of PNP input transistor QP1. The output of the bias network at the emitter node of NPN output emitter follower transistor Q3 is coupled to the base nodes of the respective tail current source transistors Q4,Q5,Q6 of current sinks Q4/R5, Q5/R6, and Q6/R7. The bias network output at the emitter node of emitter follower transistor Q3 also provides the SCS OUT signal for coupling to other current sinks in ECL gates of the selected registers of the ECL TAP as hereafter described.

The internal coupling of the bias network Q1,Q3,Q2,R2 as shown in FIG. 5 provides a stack of voltage drop components of 3VBE+VR2 between the bias network input and ground GND. The bias network output at the emitter node of emitter follower transistor Q3 is coupled between 2 VBE (VBEQ1+VBEQ3) and 1VBE and VR2 (VBEQ2+VR2) of the voltage drop stack and sets the voltage bias at the base nodes of the current source transistors Q4,Q5,Q6 at the appropriate levels for operating the current sinks. The bias network supplies base drive current not only to the current sinks Q4/R5, Q5/R6, and Q6/R7 of the latch circuit 22 of FIG. 5 but also any other current sinks coupled to the SCS output SCS OUT.

An advantage of the emitter follower coupling of the bias network output transistor Q3 is that the bias network can drive a variable load according to the number of current sinks coupled to SCS OUT while matching impedance with the load. For example the bias network Q1,Q3,Q2,R2 of the current sink switch circuit 24 incorporated in the latch circuit 22 can be coupled to drive for example the current sinks for a plurality of latches incorporated in multiple flip flops while matching the impedance requirements of the specified load.

A logic low potential level SCS signal at SCS IN causes PNP input transistor QP1 to be conducting. The input transistor QP1 draws the biasing current away from the bias network 24 so that the current sink current source transistors Q4,Q5, and Q6 are deprived of base drive current, turning off the respective current sinks. The first SCS signal of logic low potential level is therefore generated during the inactive test load reset state of the TAP controller as hereafter described. A logic high potential level condition of the SCS signal at SCS IN turns off the PNP input transistor QP1. The bias network 24 therefore draws a bias current and supplies base drive current to the current sink current source transistors Q4,Q5 and Q6, turning on the respective current sinks. The logic high potential level SCS signal is therefore generated during active test mode states of the TAP controller.

Figure 6:
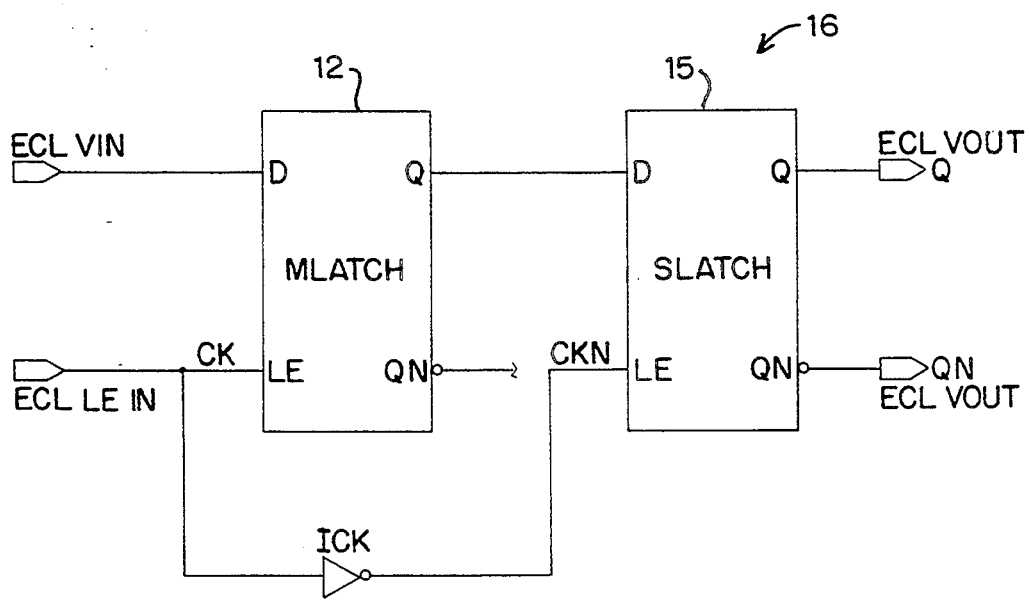
FIG. 6 is a block diagram of the conventional coupling of latch circuits to form a bistate D type bistate flip flop.

Two latches are conventionally coupled together to form a component flip flop of a register as shown in the diagram of FIG. 6. Each latch is shown with an ECL data input ECL VIN coupled to the pin labeled D and complementary ECL data outputs ECL VOUT coupled to pins Q,QN. The latch enable input ECL LE IN is coupled to the LE pin and provides an input for the clock signal CK. For a flip flop 16, latch 12 provides a master latch MLATCH while latch 15 provides a slave latch SLATCH. The true output pin Q of MLATCH 12 is coupled to the input pin D of SLATCH 15. The latch enable pin LE of MLATCH 12 is coupled to the latch enable pin LE of SLATCH 15 through an inverter, ICK, so that a clock signal, CK, at the LE pin of MLATCH 12 appears as a complementary clock signal, CKN, at the LE pin of SLATCH 15. By this arrangement the latches 12,15 provide a D type bistate flip flop device 16 for the registers of the ECL test logic.

Figure 7:
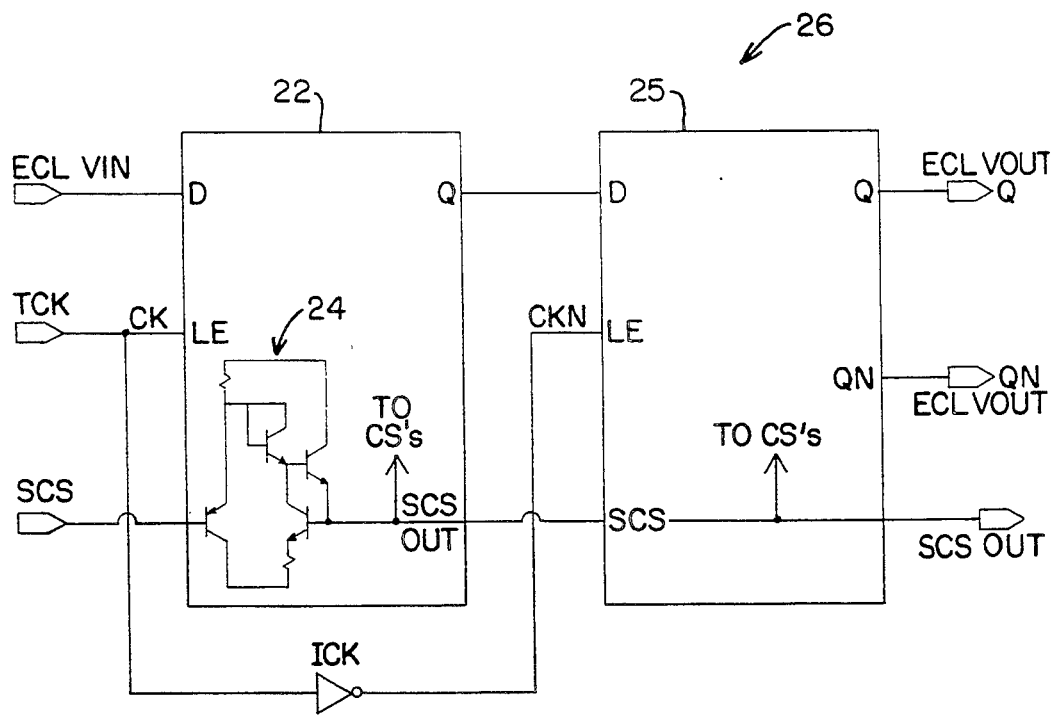
FIG. 7 is a block diagram of a flip flop of a selected register of the ECL tap composed of two latches and incorporating the current sink switch circuit according to the invention.

The latch circuit 22 of FIG. 5 is coupled to a second ECL latch circuit 25 as shown in FIG. 7 to provide a flip flop 26 for incorporating into the selected registers of the ECL TAP whose current sinks are to be turned on and off according to the state of the TAP controller. As illustrated in FIG. 7 the couplings between latch circuits 22 and 25 similar to the couplings between latch circuits 12 and 15 of FIG. 6 are indicated by the same reference designations. In addition, latch circuit 22 incorporates the current sink switch circuit 24 coupled to the current sinks CS'S of latch circuit 22 and requires an additional input pin SCS IN for receiving the switch control signal SCS at the input transistor QP1 of the current sink switch circuit 24. The latch circuit 22 also includes an additional output pin SCS OUT for delivering switch control signals to additional current sink current source transistors and in particular the current sinks for latch circuit 25. To this end latch circuit 25 is provided with an SCS input pin SCS IN for applying the switch control signal generated by the bias network of current sink switch circuit 24 to the base nodes of current sink current source transistors of latch circuit 25. Latch circuit 25 also includes an additional output pin SCS OUT for passing on the switch control signal to other current sinks in ECL gates of the selected registers. Thus, a single current sink switch circuit 24, for example incorporated in latch circuit 22 can serve the current sinks for multiple latch circuits and flip flops, for example up to a dozen or more latches.

Alternative current sink current switch circuits can also be used in place of the current sink switch circuit 24 of FIG. 5. For example, the Barre U.S. Pat. No. 4,517,476 describes a tail current switch for an ECL gate controlled by an input signal that can be adapted for use in the selected registers of the ECL TAP. The Estrada U.S. Pat. No. 5,013,938 describes a current switch for ECL gates controlled by a current mirror circuit.

As discussed above, the selected registers for control of current sinks in ECL gates of the selected registers for reducing static current and power consumption are generally the registers of the ECL TAP which are operative only during the active test mode states of the ECL TAP. The selected registers therefore include the boundary scan register BSR/TDR1, most of the design specific TAP data registers DS/TDR4 ... DS/TDRN, the TAP instruction register TIR and its instruction decode register IDR, and the optional device identification register DIR/TDR3.

The selected registers for power down of current sinks cannot include the TAP controller itself and the bypass register BR/TDR2 which must remain active at all times for responding to test mode select TMS signals and TAP clock signals TCK at the TMS and TCK pins of the test access port. The TAP controller must remain active to initiate transition from the inactive test logic reset state to active test mode states of the state diagram in response to TMS and TCK signals. The bypass register must remain active for bypassing a particular IC device without activating the test access port.

The selected registers with low power control for turning on and off the current sinks of the ECL gates may incorporate not only flip flops but also logic gates in associated logic circuits and multiplexers. The current sink current switch circuit 24 incorporated in latch circuit 22 of FIG. 5 can as well be used for controlling the current sinks of such logic gates. It is important in control of the current sinks that the on and off conditions of the current sinks be controlled by "clean" and glitch free SCS signals to prevent occurrence of spurious data or control signals. It is also important that the current sinks be turned on in a timely manner so that the selected registers are ready to respond to the TAP controller when the TAP controller makes a state transition from the inactive test logic reset state to the active run test idle state in preparation for a test mode select sequence.

Figure 8A:
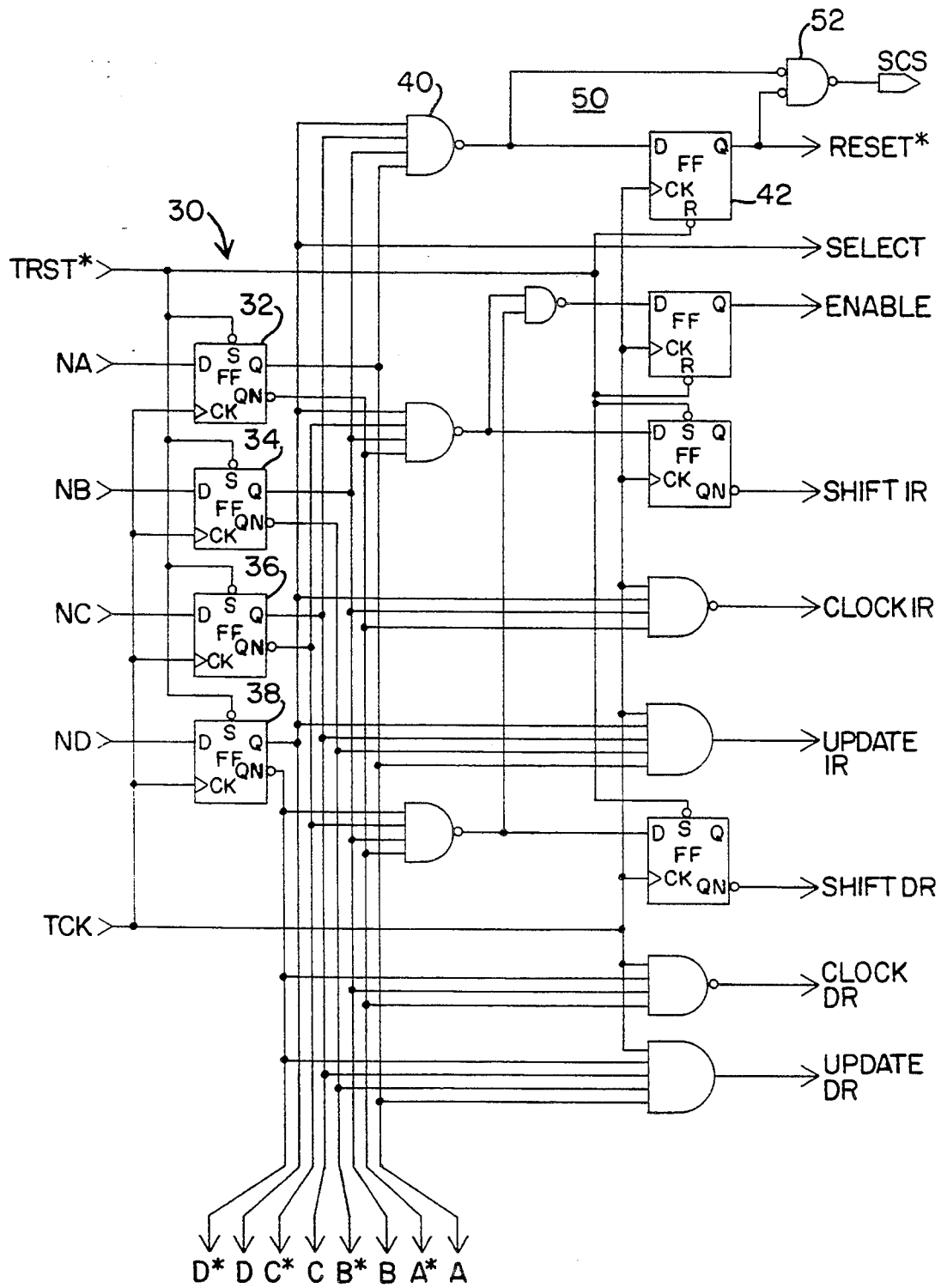
FIGS. 8A and 8B are joined at lines indicated by A,A*,B,B*,C,C*,D,D*,NA,NB, NC, and ND.
Figure 8B:
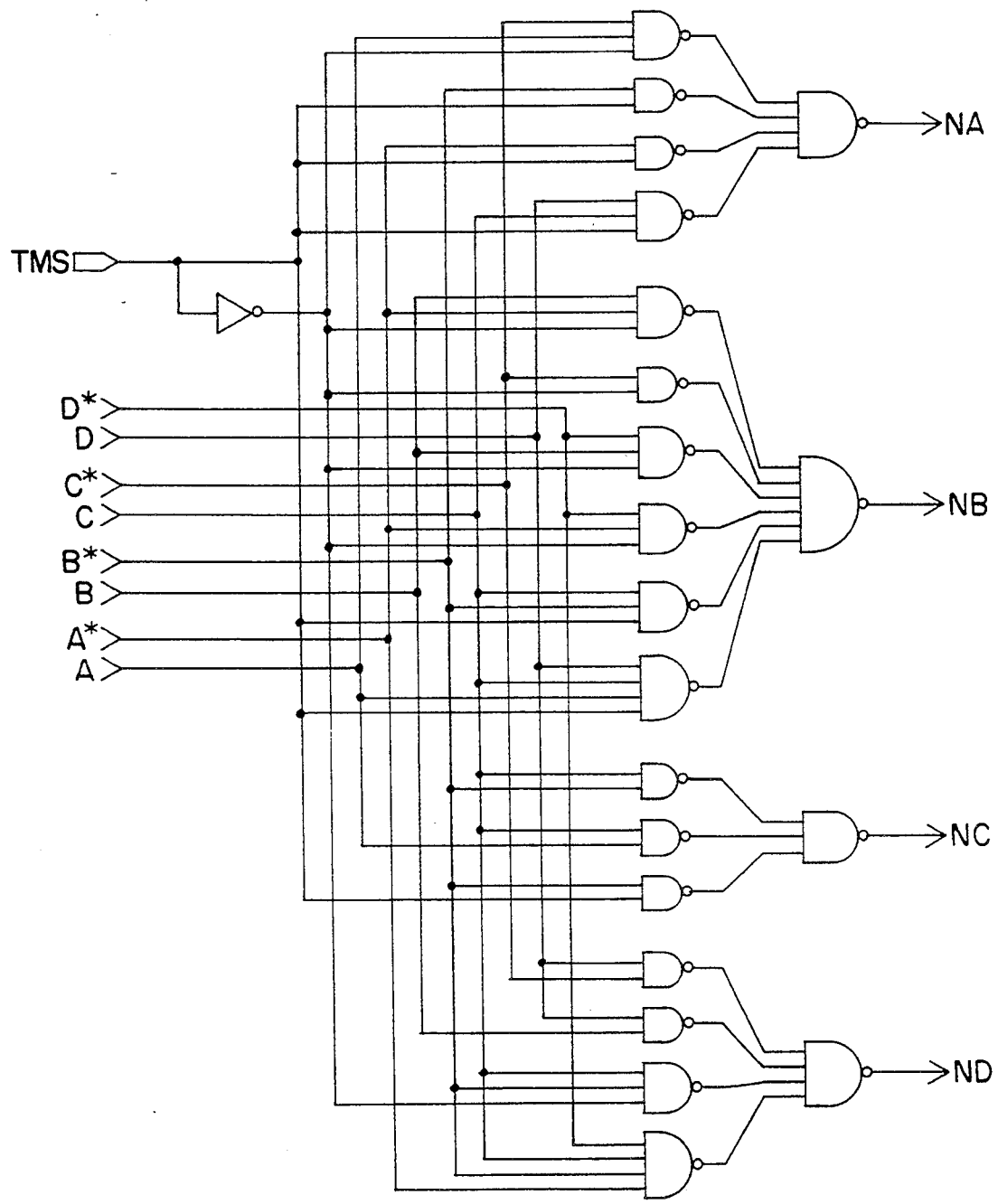

To this end an SCS logic circuit for generating timely and reliable switch control signals SCS is incorporated directly in the TAP controller as illustrated in FIG. 8. The TAP controller implementation of FIG. 8 is illustrated in two sheets FIG. 8A and FIG. 8B which are combined at the appropriate lines labels A,A*,B,B*,C,C*,D,D*, NA,NB,NC, and ND. Implementation and operation of the TAP controller example of FIG. 8 is set forth in the text of Maunder and Tulloss *THE TEST ACCESS PORT AND BOUNDARY SCAN ARCHITECTURE* cited above. The core of the test controller or TAP controller is the 16 state finite machine 30 provided by four D type flip flops 32,34,36, and 38 illustrated in FIG. 8A. The four flip flops of the 16 state finite machine have respective true outputs designated A,B,C, and D and complementary outputs respectively designated A*,B*,C*, and D*. The outputs of the flip flops 32,34,36, and 38 are associated in various combinations and permutations for example through logic gates and other flip flops to define the states of the TAP controller. The output states of the TAP controller are indicated in the right hand column of FIG. 8A, generated according to the states of the flip flops 32,34,36, and 38 and respective logic circuit portions of the TAP controller.

The four true outputs A,B,C,D of flip flops 32,34,36,38 constituting the 16 state finite machine are combined together at the inputs of a first logic gate, a conjunctive NAND gate 40, available in the original example TAP controller suggested by IEEE Standard 1149.1. The output of NAND gate 40 provides the input to reset flip flop 42 which provides at its true output Q a negative logic reset output, RESET*. Reset flip flop 42 can also be actuated by a negative logic test reset input signal TRST, through an optional TRST* pin of the test access port.

Figure 1:
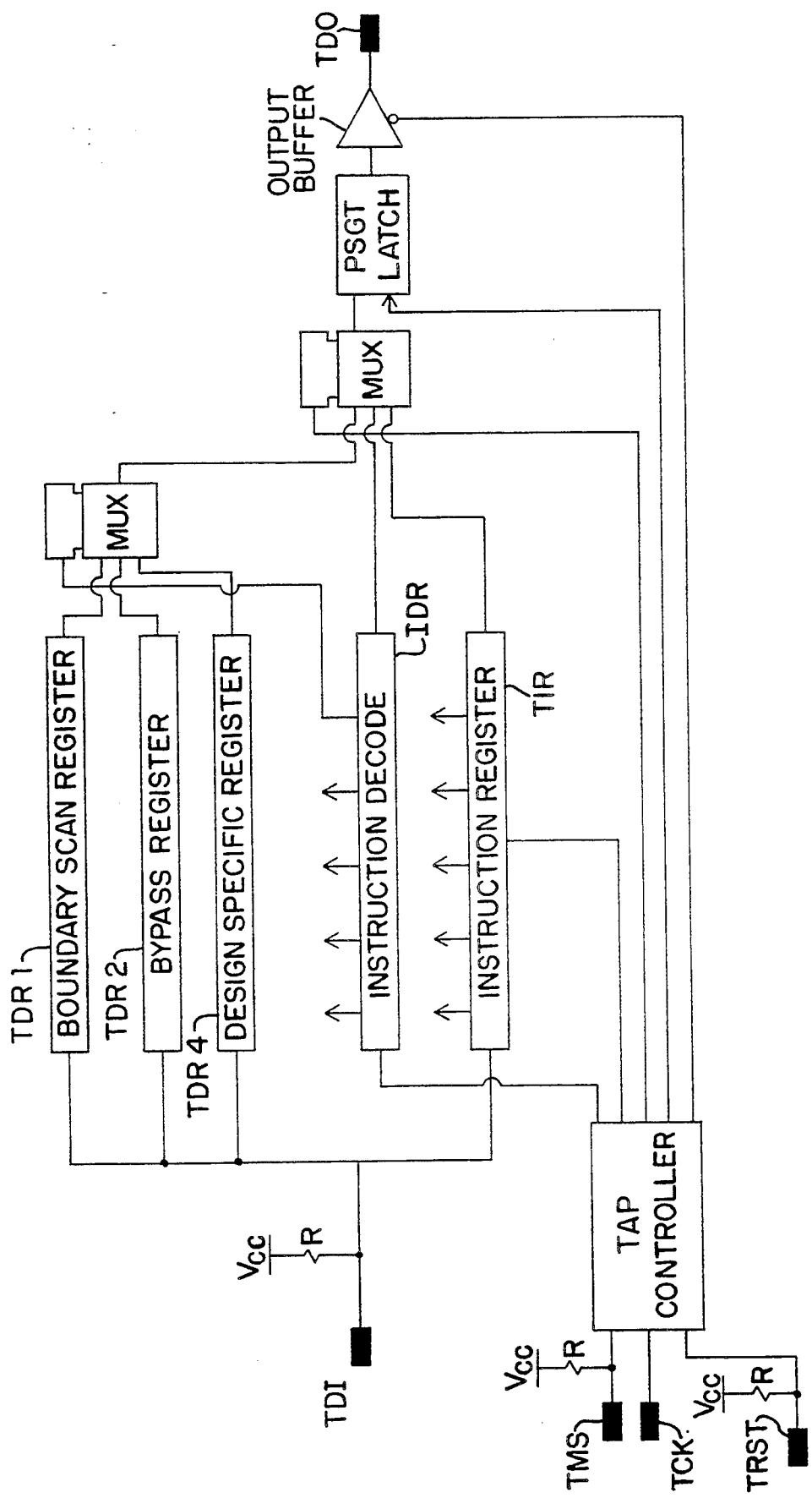
FIG. 1 is a schematic block diagram of an IC device test access port which conforms with the requirements of IEEE Standard 1149.1 Test Access Port and Boundary Scan Architecture, JTAG Protocol Version 2.0.
Figure 2:
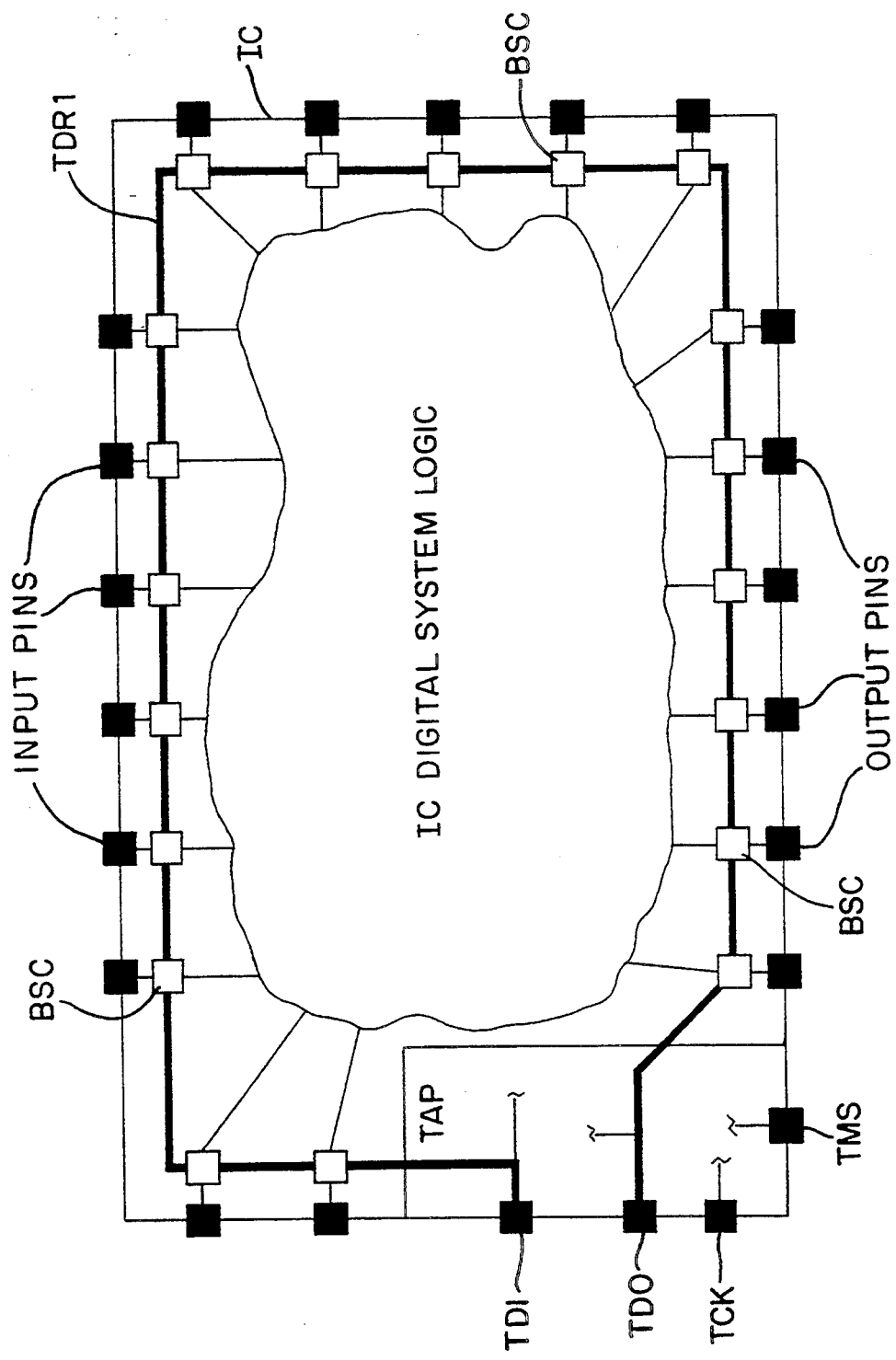
FIG. 2 is a detailed schematic block diagram of an example boundary scan register (BSR/TDR1) for the test access port of FIG. 1 showing the location of the boundary scan cells (BSC's).
Figure 3:
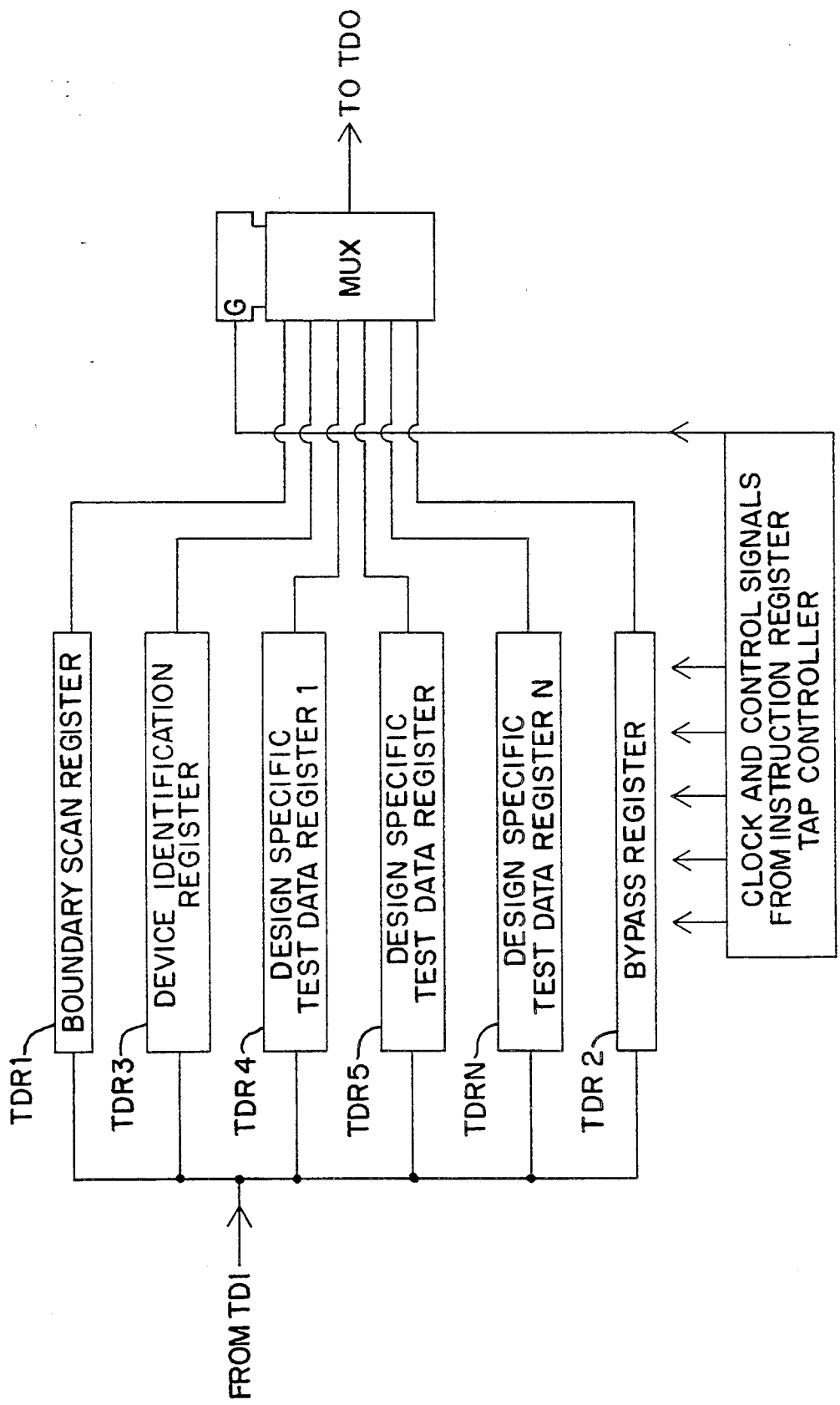
FIG. 3 is detailed schematic block diagram of the TAP data registers (TDR1...TDRN) for an IEEE Standard 1149.1 compliant test access port.
Figure 4:
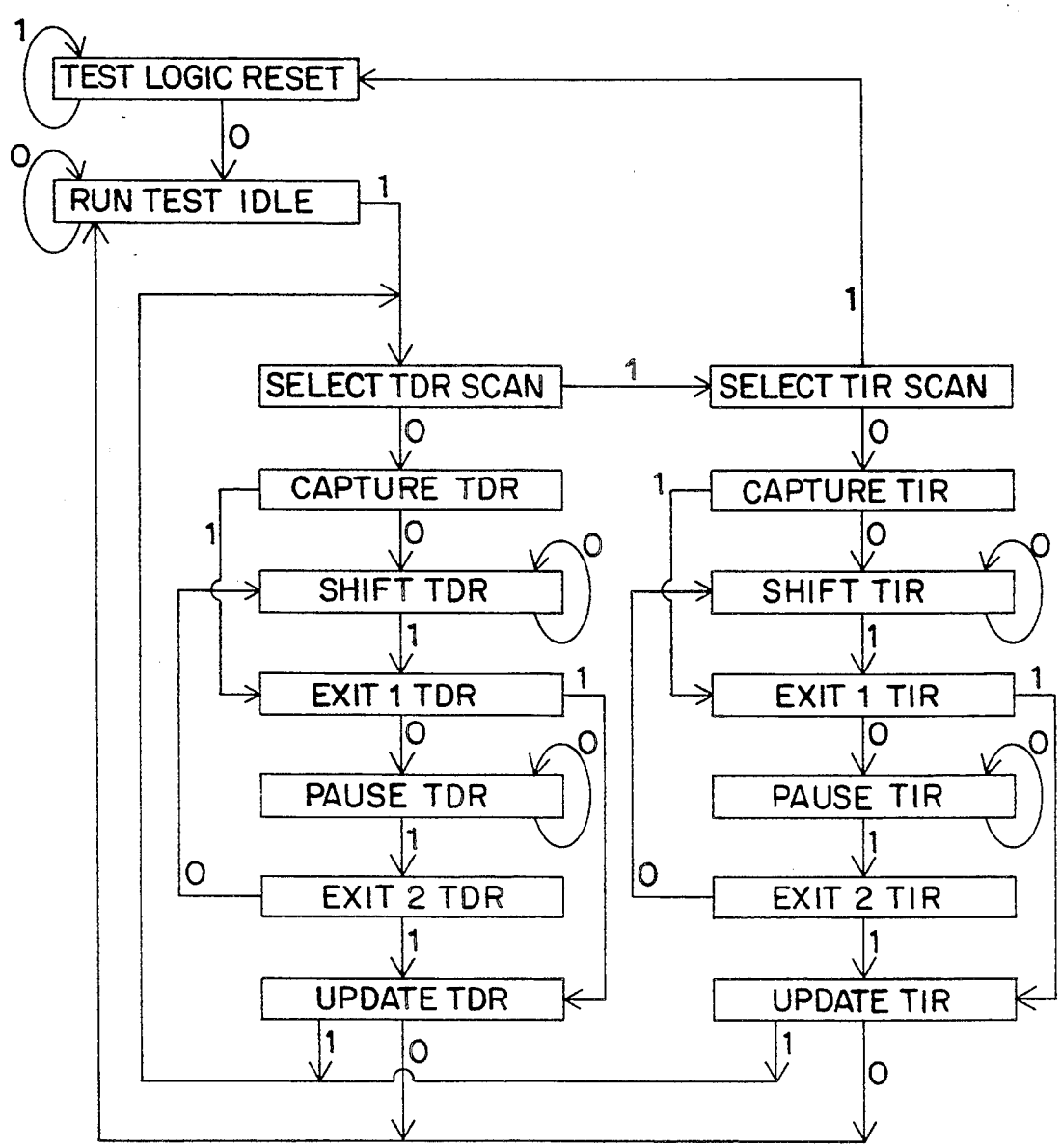
FIG. 4 is a detailed block diagram flow chart showing the state diagram for the TAP controller of an IEEE Standard 1149.1 compliant test access port.

When all of the true outputs A,B,C,D of the flip flops 32,34,36,38 are at logic high level 1, the TAP controller is in test logic reset (TLR) state of the state diagram of FIG. 4 and the test access port is inactive. The TAP controller remains in the TLR state as long as the TMS signal is also at a logic high potential level 1. While the TAP controller remains in the TLR state the output of NAND gate 40 is a logic low potential level 0. In the suggested TAP controller for IEEE Standard 1149.1 the reset flip flop 42 then follows the output of NAND gate 40 one half clock pulse later at the falling edge of the clock pulse so that the RESET, output is also at logic low potential level 0. The positive logic true reset signal not shown is at logic high potential level 1.

Upon occurrence of a TMS 0 signal at the TAP controller, a true output of at least one of the flip flops 32,34,36,38 changes from 1 to 0 and the output of NAND gate 40 changes from 0 to 1. This transition is followed one half clock cycle later by transition from 0 to 1 of the RESET* output signal from reset flip flop 42. The TAP controller then runs through a test mode sequence of selected active test mode states according to the TMS and TCK signals at the TMS and TCK pins of the test access port.

An SCS logic circuit 50 is incorporated into the TAP controller using the foregoing elements of the TAP controller for generating a reliable switch control signal SCS for actuating the current sink switch circuit 24 of FIGS. 5 and 7. In the example of FIG. 8 the SCS logic circuit 50 incorporates a second logic gate in the form of a negative input conjunctive NAND gate 52 in the TAP controller. The negated inputs to negative NAND gate 52 are coupled respectively to the output of NAND gate 40 and the RESET* output of reset flip flop 42. The output of negative input NAND gate 52, also referred to herein as NOT/NAND gate 52 provides the switch control signals SCS coupled to the SCS input SCS IN at the input transistor QP1 of the current sink switch circuit 24. As used herein, conjunctive logic gate includes AND, NAND, and NOT/NAND logic gates and their logical equivalents for example a disjunctive OR gate, the logical equivalent of a NOT/NAND gate.

Following the logical operation of the SCS logic circuit 50, when the TAP controller is in the inactive TLR state with the true outputs A,B,C,D of flip flops 32,34,36, 38 at logic high potential level 1, the output of NAND gate 40 is low. The RESET* output of reset flip flop 42 follows ½ clock cycle later to a logic low potential level. These low inputs to NOT/NAND logic gate 52 are inverted. The output of NOT/NAND gate 52 is therefore low and the first SCS signal is a logic low potential level signal. A low signal at the SCS input SCS IN of PNP input transistor QP1 of the current sink switch circuit 24 shown in FIGS. 5 and 7 turns on QP1 to the conducting state diverting biasing current from the biasing network Q1,Q3,Q2,R2. The current sinks of the latches and flip flops of the selected registers are therefore turned off and the selected registers remain powered down during the test logic reset TLR state. Instead of "positive" logic, "negative" logic signals may of course be used with substitution of appropriate logic gates.

Upon occurrence of a TMS 0 signal at the TMS pin of the test access port and TAP controller, a true output of at least one of the four flip flops 32,34,36,38 of the 16 state finite machine undergoes transition from logic 1 to 0. As a result the output of the four flip flop finite machine NAND gate 40 switches from 0 to 1. The negated input to NOT/NAND gate 52 from the output of NAND gate 40 therefore switches from 1 to 0 initiating transition of the switch control signal SCS from logic low potential level 0 to logic high potential level 1. The second switch control signal SCS at the SCS input SCS IN of PNP input transistor QP1 turns off QP1 permitting bias current to flow through the bias network Q1,Q3,Q2,R2 of the current sink switch circuit 24. The bias network supplies base drive current turning on the current sinks for ECL gates of the selected registers of the ECL TAP.

Thus the initiation of the transition of the TAP controller from inactive test logic reset state to the run test idle state in preparation for a test mode sequence is accompanied by timely turning on of the current sinks in the selected registers so that they are ready to receive data or instructions in accordance with the test mode sequence. Because the TAP controller requires at least two clock signals TCK to initiate a test mode sequence using the selected registers, there is sufficient time to complete turn on of the current sinks.

Returning to the SCS logic circuit 50 of FIG. 8A, the RESET, output of reset flip flop 42 follows the output of NAND gate 40 one half clock cycle later, also making the transition from logic low potential level to logic high potential level. The RESET* output to the input of NOT/NAND gate 52 is inverted, holding the switch control signal SCS at the logic high potential level. The output of conjunctive NAND gate 40 may be subject to spurious glitches or spikes on the multiple inputs. On the other hand the RESET* output of reset flip flop 42 is a clean stable signal. The RESET* signal at the input of NOT/NAND gate 52 therefore reliably holds the output switch control signal SCS at the logic high potential level despite spikes or glitches at the output of NAND gate 40. The SCS logic circuit 50 therefore reliably holds the current sinks in the conducting state during active test mode sequences of the TAP controller.

Figure 9:
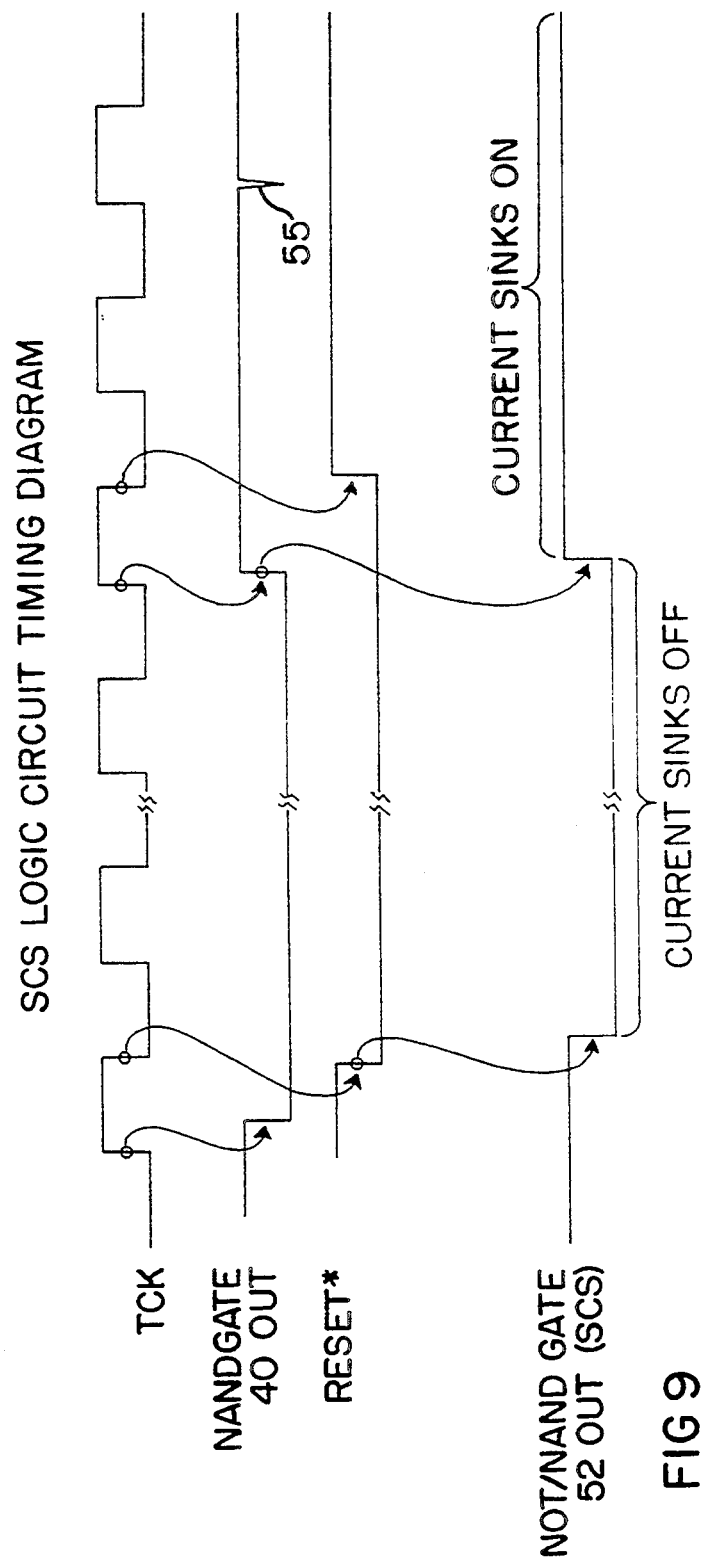
FIG. 9 is a timing diagram describing the operation of TAP controller and SCS logic circuit.

A timing diagram illustrating the operation of the SCS logic circuit 50 incorporated in the TAP controller of FIGS. 8A and 8B is illustrated in FIG. 9. Relative timing and phase information is provided for the test access port clock signal TCK, NAND gate 40 output, RESET* output, and NOT/NAND gate 52 output. The NOT/NAND gate 52 output constitutes the switch control signal SCS. As shown in FIG. 9, spurious glitches or spikes 55 in the output from NAND gate 40 are effectively filtered at NOT/NAND gate 52 by the presence of the stable RESET* output signal applied at the input of NOT/NAND gate 52. While turning off the current sinks of ECL gates incorporated in the selected registers is not time critical, the turning on of the current sinks must be completed before the TAP controller reaches the capture TDR state or capture TIR state. The SCS logic circuit 50 and current sink switch circuit 24 accomplish this objective well within the minimum 2 clock cycles available when the TAP controller undergoes transition from the test logic reset state. Furthermore the SCS logic circuit coupling of the NAND gate 40 output provides a further margin of safety for turn on of the current sinks a half of a clock cycle ahead of the RESET* signal.

More generally, the first logic gate 40 of the TAP controller of FIGS. 8A and 8B can be viewed as a decoding logic circuit or decoder for monitoring the outputs of the n state finite machine flip flops 32,34,36,38. Thus, the outputs of the respective flip flops need not all be 1's for implementing a TLR inactive state. For other logic combinations and arrangements, the decoder 40 can be appropriately designed to give the desired output signal according to the implementation. The output of decoder 40 is then logically combined with the reset output RESET* to give the desired SCS signal value.

While the invention is described with reference to particular example embodiments it is intended to cover all modifications and equivalents within the scope of the following claims.

I claim:

1. An integrated circuit device ECL test access port (TAP) having a plurality of test data registers including a boundary scan register for performing boundary scan testing, a bypass register for providing a minimum path, and optional design specific test data registers and a TAP controller comprising an n state finite machine of a plurality of flip flops whose outputs determine the state of the TAP controller, said TAP controller having a test logic reset state in which the test access port is inactive and a plurality of test mode states when the test access port is active, said registers and TAP controller of the ECL test access port comprising ECL gates with respective ECL current sinks, the improvement comprising:

said TAP controller comprising a switch control signal (SCS) logic circuit incorporated in the TAP controller for generating a current sink switch control signal (SCS) according to the state of the TAP controller, said TAP controller being constructed so that the outputs of the flip flops comprising the TAP controller n state finite machine are at specified logic potential levels during the test logic reset state of the TAP controller, said SCS logic circuit for generating the current sink switch control signal SCS comprising a first logic gate having inputs coupled to the outputs of the TAP controller n state finite machine flip flops;

a current sink switch circuit coupled to respective current sinks of ECL gates incorporated in the boundary scan register and design specific TAP data registers, said current sink switch circuit having an input coupled to the SCS logic circuit to receive the current sink switch control signal SCS and being constructed to turn off said respective current sinks in response to a first SCS signal to reduce power dissipation when the TAP controller is in the inactive test logic reset state.

2. The IC device ECL TAP of claim 1 wherein said current sink switch circuit is constructed to turn on said current sinks in response to a second SCS signal when the TAP controller is active in a test mode state.

3. The IC device ECL TAP of claim 2 wherein the current sinks for the ECL gates of the selected registers of the test access port comprise a bipolar tail current transistor and tail resistor coupled to the emitter node of the tail current transistor, and wherein said current sink switch circuit comprises a bias network coupled to the base nodes of the respective tail current transistors for the boundary scan register and design specific TAP data registers, said bias network having an input transistor coupled to the SCS logic circuit for turning on the bias network to the conducting state and thereby turning on the respective current sinks in response to a second SCS signal at the bias network input transistor when the TAP controller is in an active test mode state and for turning off the bias network and thereby turning off the respective current sinks in response to a first SCS signal when the TAP controller is in the inactive test logic reset TLR state.

4. The IC device ECL TAP of claim 1 wherein the test access port further comprises an IC device identification register comprising ECL gates with respective ECL current sinks and wherein the current sink switch circuit is also coupled to the respective current sinks of the ECL gates incorporated in the device identification register.

5. The IC device ECL TAP of claim 1 wherein the TAP further comprises a TAP instruction register (TIR) for receiving instruction codes for the TAP controller, said TIR comprising ECL gates and corresponding current sinks, and wherein the current sink switch circuit is coupled to respective current sinks of the ECL gates incorporated in the TIR.

6. The IC device ECL TAP of claim 1 wherein the TAP controller is constructed to provide a reset output and a first logic gate output, said reset output and first logic gate output being coupled to inputs of a second logic gate providing the current sink switch control signal SCS at its output.

7. The IC device ECL TAP of claim 1 wherein the first logic gate is a NAND gate and the second logic gate is a NOT/NAND gate.

8. The IC device with ECL TAP of claim 1 wherein the SCS logic circuit comprises a decoder logic gate having inputs coupled to the outputs of the flip flops of the n state finite machine of the TAP controller and a decoder logic gate output, said TAP controller having a reset flip flop reset output and a second logic gate having inputs coupled to the decoder logic gate output and the reset output, the output of said second logic gate providing the SCS signal.

9. The IC device with ECL TAP of claim 1 wherein the SCS logic circuit comprises a decoder logic circuit having inputs coupled to the outputs of the flip flops of the n state finite machine of the TAP controller and a decoder logic circuit output, said TAP controller having a reset output, and an OR gate having inputs coupled to the decoder logic circuit output and the reset output, the output of said OR gate providing the SCS signal.

10. The IC device ECL TAP of claim 8 wherein the current sinks for the ECL gates of the selected registers of the test access port comprise a bipolar tail current transistor and tail resistor coupled to the emitter node of the tail current transistor, and wherein said current sink switch circuit comprises a bias network coupled to the base nodes of the respective tail current transistors for the boundary scan register and design specific TAP data registers, said bias network having an input transistor coupled to the SCS logic circuit for turning on the bias network to the conducting state and thereby turning on the respective current sinks in response to a second SCS signal at the bias network input transistor when the TAP controller is in an active test mode state and for turning off the bias network and thereby turning off the respective current sinks in response to a first SCS signal when the TAP controller is in the inactive test logic reset TLR state.

11. An integrated circuit device ECL test access port (TAP) having dedicated TAP access pins and associated pin electronics including a TAP data input (TDI) pin, a TAP data output (TDO) pin, a TAP mode select (TMS) pin, and a TAP clock (TCK) pin, said test access port having a plurality of TAP data registers (TDR's) coupled to receive data signals at the TDI pin and to shift data signals to the TDO pin, said TDR's including a boundary scan register for performing boundary scan testing, a bypass register for providing a minimum path between the TDI and TDO pins, and optional design specific test data registers, a TAP instruction register (TIR) coupled to receive instruction codes at the TDI pin and to direct use of selected TDR's, and a TAP controller coupled to receive control signals at the TMS pin and clock signals at the TCK pin and to provide control and clock signals for controlling operation of the TIR and TDR's, said TAP controller comprising a n state finite machine of a plurality of flip flops, said TAP controller having a test logic reset state in which the test access port is inactive and a plurality of test mode states when the test access port is active, said registers and TAP controller of the ECL test access port comprising ECL gates with respective ECL current sinks, the improvement comprising:

said TAP controller comprising a switch control signal (SCS) logic circuit coupled to the outputs of the flip flops of the n state finite machine of the TAP controller for generating a current sink switch control signal SCS having a first logic value when the TAP controller is in the inactive test logic reset state and a second logic value when the TAP controller is in an active test mode state;

a current sink switch circuit coupled to respective current sinks of ECL gates incorporated in selected registers of the TAP, namely the boundary scan register, design specific TAP data registers, and TAP instruction register (TIR) said current sink switch circuit having an input coupled to receive the current sink switch control signals SCS and being constructed to turn on and off said respective current sinks of the selected registers, turning off the current sinks in response to said SCS signal first logic value to reduce power dissipation during the test logic reset (TLR) inactive state of the TAP controller, and turning on the current sinks in response to said SCS signal second logic value for operation of the TAP during active test mode states of the TAP controller.

12. The IC device ECL TAP of claim 11 wherein the test access port further comprises an IC device identification register comprising ECL gates with respective ECL current sinks and wherein the current sink switch circuit is also coupled to the respective current sinks of the ECL gates incorporated in the device identification register.

13. The IC device ECL TAP of claim 11 wherein the TAP controller is constructed so that the outputs of the flip flops comprising the TAP controller n state finite machine are at specified logic potential levels during the test logic reset state of the TAP controller and wherein the SCS logic circuit for generating the current sink switch control signal SCS comprises a first logic gate coupled to the outputs of said flip flops of the n state finite machine.

14. The IC device ECL TAP of claim 13 wherein the TAP controller is constructed to provide a stable reset output and a first logic gate output, said first logic gate output having inputs coupled to the respective outputs of the flip flops of the TAP controller n state finite machine, said reset output and first logic gate output being coupled to inputs of a second logic gate providing the current sink switch control signal SCS at the output of the second logic gate.

15. The IC device ECL TAP of claim 11 wherein the current sinks for the ECL gates of the selected registers of the test access port comprise a bipolar tail current transistor and tail resistor coupled to the emitter node of the tail current transistor, and wherein the current sink switch circuit comprises a bias network coupled to the base nodes of the respective tail current transistors for the selected registers said bias network having an input transistor coupled to the SCS logic circuit for turning on the bias network to the conducting state and thereby turning on the respective current sinks in response to the SCS signal second logic value at the bias network input transistor when the TAP controller is in an active test mode state and for turning off the bias network and thereby turning off the respective current sinks in response to the SCS signal first logic value when the TAP controller is in the inactive test logic reset TLR state.

16. The IC device with ECL TAP of claim 15 wherein the SCS logic circuit comprises a NAND gate having inputs coupled to the outputs of the flip flops of the n state finite machine of the TAP controller, said TAP controller having a reset flip flop reset output, and a NOT/NAND gate having negated inputs coupled to the NAND gate output and the reset output, the output of said NOT/NAND gate providing the SCS signals.

17. The IC device with ECL TAP of claim 11 wherein the SCS logic circuit comprises a decoder having inputs coupled to the outputs of the flip flops of the n state finite machine of the TAP controller and a decoder output, said TAP controller having a reset output, and a logic gate having inputs coupled to the decoder output had the reset output, the output of said logic gate providing the SCS signals.

18. The IC device ECL TAP of claim 14 wherein the decoder is a NAND gate and the logic gate is a NOT/NAND gate.

19. The IC device ECL TAP of claim 14 wherein the decoder is a NAND gate and the logic gate is an OR gate.

* * * * *